(12) United States Patent
Komoto

(10) Patent No.: US 6,353,872 B1
(45) Date of Patent: Mar. 5, 2002

(54) MEMORY INTERFACE CIRCUIT

(75) Inventor: Eiji Komoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/228,567

(22) Filed: Jan. 12, 1999

(30) Foreign Application Priority Data

Jun. 4, 1998 (JP) .......................................... 10-156326

(51) Int. Cl.$^7$ .............................................. G06F 13/18
(52) U.S. Cl. ...................... 711/106; 365/222; 711/150; 711/151; 711/158; 711/168
(58) Field of Search ........................ 365/222; 711/106, 711/166, 158, 168, 150–151; 710/40, 111, 114, 116, 121, 123, 244, 129

(56) References Cited

U.S. PATENT DOCUMENTS

| | | | | |
|---|---|---|---|---|
| 4,106,108 A | * | 8/1978 | Cislaghi et al. | 365/222 |
| 4,849,936 A | * | 7/1989 | Mizutani | 365/189.01 |
| 5,216,635 A | * | 6/1993 | Kass et al. | 365/222 |
| 5,418,920 A | * | 5/1995 | Kuddes | 711/106 |
| 5,479,372 A | * | 12/1995 | Sato et al. | 365/222 |
| 5,524,235 A | * | 6/1996 | Larson et al. | 711/151 |
| 5,557,578 A | * | 9/1996 | Kelly | 365/222 |
| 5,583,823 A | | 12/1996 | Park | 365/230.03 |
| 5,873,114 A | * | 2/1999 | Rahman et al. | 711/106 |

FOREIGN PATENT DOCUMENTS

JP 06020468 A 1/1994
JP 09106674 A 4/1997

* cited by examiner

Primary Examiner—Kevin L. Ellis
Assistant Examiner—Denise Tran
(74) Attorney, Agent, or Firm—Volentine Francos, PLLC

(57) ABSTRACT

A memory bus arbitrating circuit selects the request signal with the highest priority when a plurality of types of same are inputted simultaneously. A memory controlling circuit executes relative to memory control of memory bus arbitrating circuit-selected processing. A first monitoring circuit outputs a first refresh request signal when the count value of a refresh counter reaches a first prescribed value. A second monitoring circuit outputs a second refresh request signal when the count value of a refresh counter reaches a second prescribed value, which is, for example, ½ of the first prescribed value. The first, second refresh request signals are inputted to the memory bus arbitrating circuit. The memory bus arbitrating circuit regards the first refresh request signal as the request signal with the highest priority, and regards the second refresh request signal as the request signal with the lowest priority. When the second refresh request signal is inputted, memory refresh is performed only when there are no other processing requests, and when the first refresh request signal is inputted, memory refresh is performed in a compulsory manner even if there is other processing. After refresh, the count value of the refresh counter is reset. By using a second refresh request signal, it is possible to reduce the probability of the first refresh request signal being inputted to the memory bus arbitrating circuit at the same time as a request signal of other processing.

14 Claims, 6 Drawing Sheets

MEMORY INTERFACE CIRCUIT

BACKGROUND OF THE INVENTION

1. Field of the Invention

The present invention relates to a memory interface circuit comprising a function for refreshing memory. The present invention can be applied to a memory interface circuit, which is used, for example, in an ordinary DRAM (Dynamic Random Access Memory), and a synchronous DRAM.

2. Description of Related Art

As is commonly known, a DRAM stores binary data in accordance with whether or not a charge is stored on a capacitor in each memory cell. For this reason, an operation, which replenishes the charge to each memory cell capacitor, is necessary to prevent a memory value from being destroyed by capacitor leakage current. This operation is called "refresh."

In a DRAM, refresh must be performed cyclically to ensure the prevention of memory data destruction. Therefore, in an ordinary DRAM, the execution of a refresh operation takes priority over a read/write operation. That is, a DRAM will make a read/write access wait, and accept a refresh access first.

However, if read/write access is made to wait every refresh cycle, the time required for a DRAM read operation and write operation will substantially increase. For this reason, for a highspeed system, there are cases in which the performance of the entire system deteriorates because read/write operations are slow. Further, depending on the system, there are also cases in which malfunctions occur because of a slow response to a read/write request.

SUMMARY OF THE INVENTION

An object of the present invention is to provide a memory interface circuit, which is capable of executing at high speed other processes in memory, while ensuring the prevention of memory data destruction.

(1) In accordance with a first standpoint of the present invention, a memory interface circuit comprising memory bus arbitrating means, which is inputted with a plurality of types of refresh request signals, and 1 type, or a plurality of types of other processing request signals, and which selects from among the simultaneously-inputted request signals the one with the highest priority; memory controlling means for controlling memory on the basis of a request signal selected by memory bus arbitrating means; counting means for counting timing for refreshing memory; and a plurality of types of monitoring means for outputting refresh request signals with mutually differing priorities at mutually differing timing in accordance with a counting value of counting means.

(2) In accordance with a second standpoint of the present invention, a memory interface circuit comprising memory bus arbitrating means, which is inputted with a refresh request signal, and other processing request signals, and selects from among the simultaneously-inputted request signals the one with the highest priority; memory controlling means for controlling memory on the basis of a request signal selected by memory bus arbitrating means, and output a termination signal when a prescribed processing among other processing ends; counting means for counting timing for refreshing memory; monitoring means for outputting a refresh request signal in accordance with a counting value of counting means; and gate means for supplying a refresh request signal to memory bus arbitrating means when a termination signal is outputted.

(3) In accordance with a third standpoint of the present invention, a memory interface circuit comprising memory bus arbitrating means, which is inputted with a refresh request signal, and other processing request signals, and selects from among the simultaneously-inputted request signals the one with the highest priority; memory controlling means for controlling memory on the basis of a request signal selected by memory bus arbitrating means; counting means for counting timing for refreshing memory; and monitoring means for outputting a refresh request signal on the basis of a result of comparing a count value of this counting means against a comparison value stored in overwrite-capable memory.

BRIEF DESCRIPTION OF THE DRAWINGS

Other objects and advantages of the present invention are explained below with reference to the accompanying figures.

DESCRIPTION OF THE PREFERRED EMBODIMENTS

Aspects of the embodiment of the present invention are explained below using the figures. Furthermore, be cognizant of the fact that the size, shape and physical relationship of each constituent element in the figures are merely approximate illustrations to enable an understanding of the present invention, and further, that the numerical conditions explained below are nothing more than examples.

First Embodiment

Figure 1:
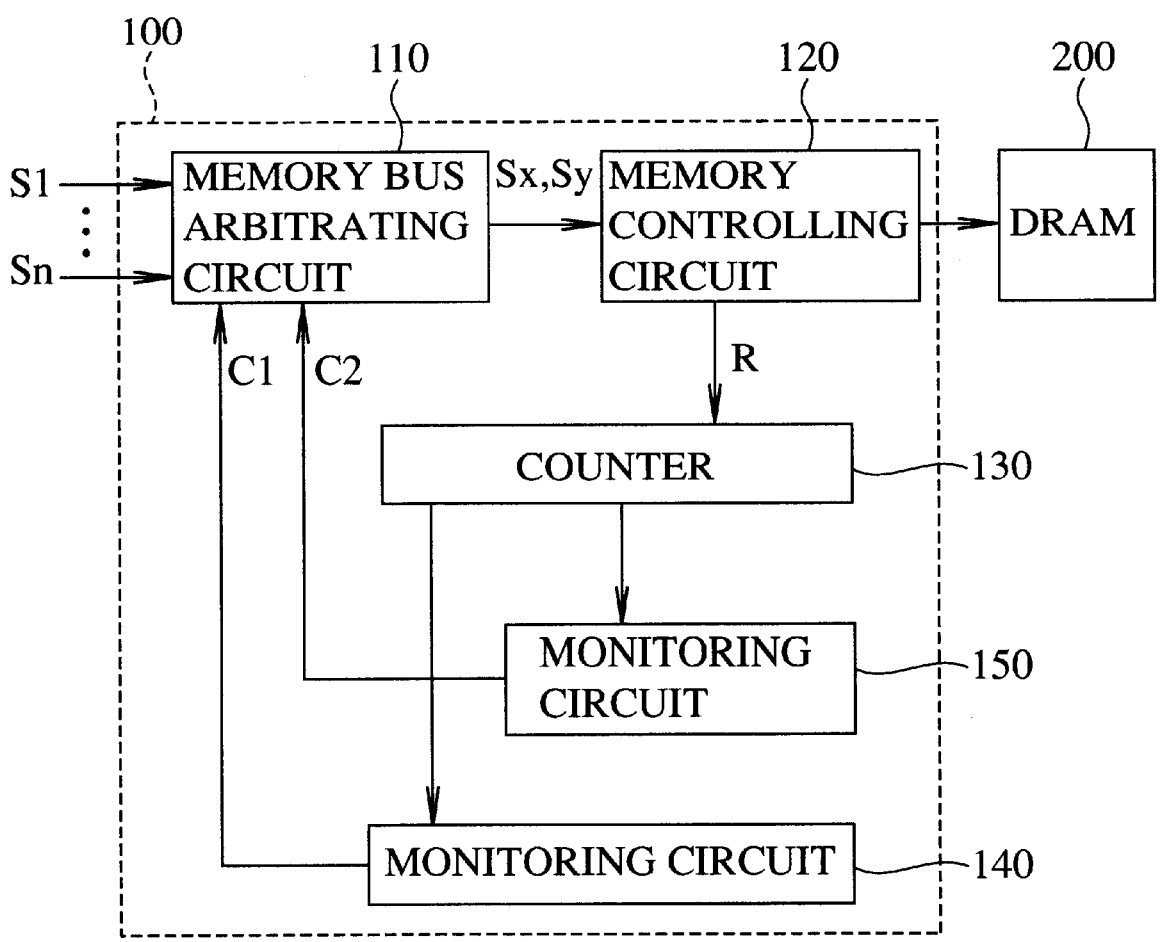
FIG. 1 is a block diagram showing a memory interface circuit related to a first embodiment.

A first embodiment of the present invention is explained using FIG. 1 and FIG. 2.

As shown in FIG. 1, this memory interface circuit 100 comprises a memory bus arbitrating circuit 110, a memory controlling circuit 120, a counter 130, and monitoring circuits 140, 150.

As for the memory bus arbitrating circuit 110, request signals S1, S2 . . . , Sn are inputted from the outside, refresh request signal C1 is inputted from monitoring circuit 140, and refresh request signal C2 is inputted from monitoring circuit 150. When each of these request signals S1–Sn, C1, C2 is inputted, circuit 110 outputs a bus request signal Sx, which indicates that a processing request was performed, and a processing type signal Sy, which indicates the type of the request signal. When a plurality of types of request signals are inputted simultaneously, circuit 110 outputs a type signal Sy, which corresponds to the request signal with the highest priority thereamong. A read processing request signal and a write processing request signal are included as request signals S1–Sn. For this embodiment, C1 is regarded as the signal with the highest priority, and C2 is regarded as the signal with the lowest priority. The priorities of signals S1–Sn can be suitably set. For example, in descending order from the highest, the priority is regarded as C1, S1, S2, ..., Sn, C2.

Figure 2A:
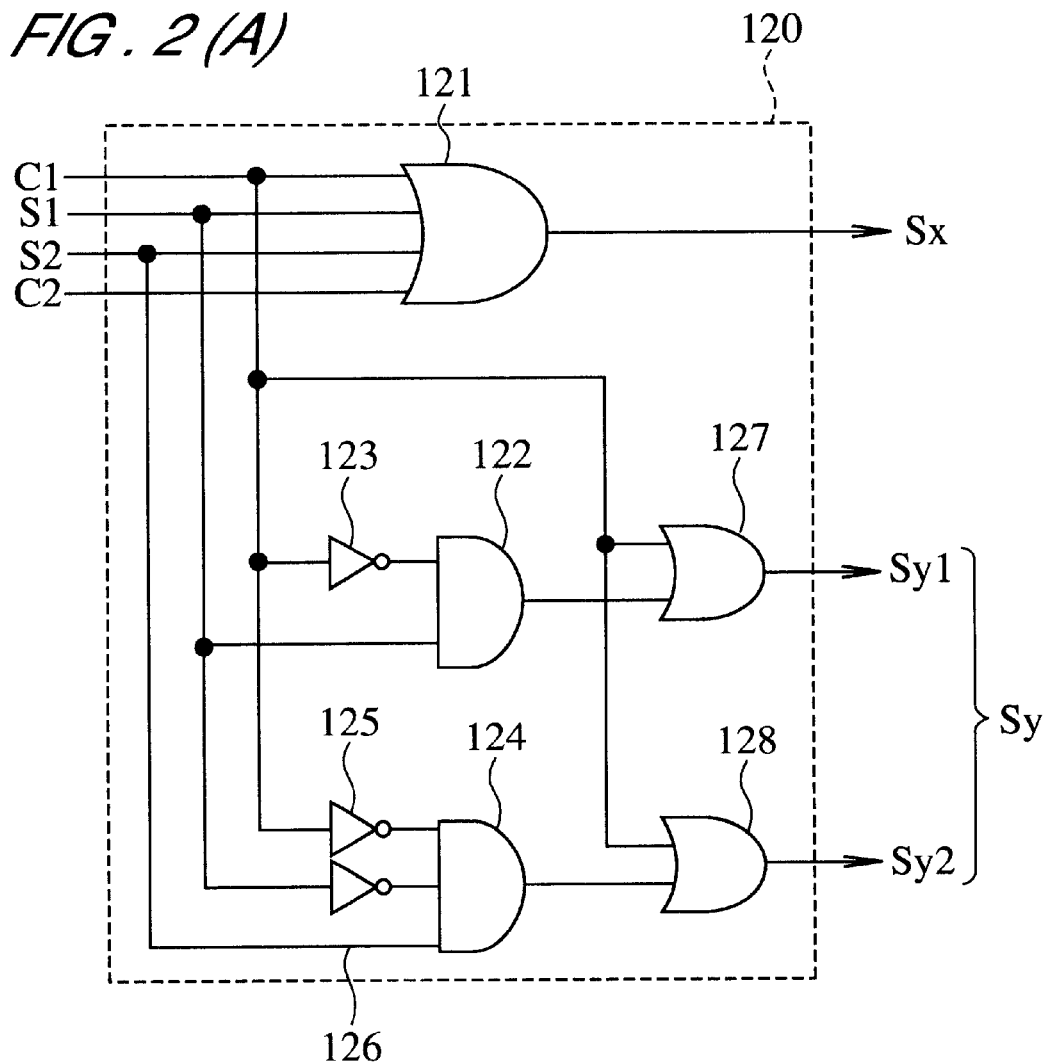
In FIG. 2, (A) is a logic circuit diagram showing an example of an internal constitution of the memory bus arbitrating circuit illustrated in FIG. 1, and (B) is a block diagram showing an example of an internal constitution of the memory controlling circuit illustrated in FIG. 1.

FIG. 2(A) shows one example of the internal constitution of the memory bus arbitrating circuit 120. FIG. 2 illustrates a circuit constitution when n=2, that is, when request signals C1, C2, S1, S2 are accepted.

As shown in FIG. 2(A), in this circuit 120, an OR gate 121 is inputted with signals C1, C2, S1, S2, and outputs signal Sx.

AND gate 122 is inputted with signal C1 via a NOT gate 123, and is inputted with signal S1 directly. AND gate 124 is inputted with signal C1 via a NOT gate 125, is inputted with signal S1 via a NOT gate 126, and is inputted with signal S2 directly.

OR gate 127 is inputted with the output signal of AND gate 122 and signal C1, and outputs processing type signal Sy1. OR gate 128 is inputted with the output signal of AND gate 124 and signal C1, and outputs processing type signal Sy2. That is, in the case of FIG. 2(A), the processing type signal Sy is a 2-bit signal Sy1, Sy2.

For the circuit 120 illustrated in FIG. 2, when at least one of signals C1, C2, S1, S2 is high level, signal Sx becomes high level.

Here, when signal C1 is high level, signals Sy1, Sy2 become high level, despite the level of the other signals S1, S2, C2. When signal C1 is low level, and signal S1 is high level, signal Sy1 is high level, and signal Sy2 is low level, despite the levels of the other signals S2, C2. When signals C1, S1 are low level, and signal S2 is high level, signal Sy1 is low level, and signal Sy2 is high level, despite the level of signal C2. And when signals C2, S1, S2 are low level, and signal C2 is high level, signals Sy1, Sy2 become low level.

That is, for this circuit 120, the request signal priority becomes C1, S1, S2, C2.

The memory controlling circuit 120 in FIG. 1 controls a DRAM based on signals Sx, Sy, and executes read/write processing, and refresh processing.

Figure 2B:
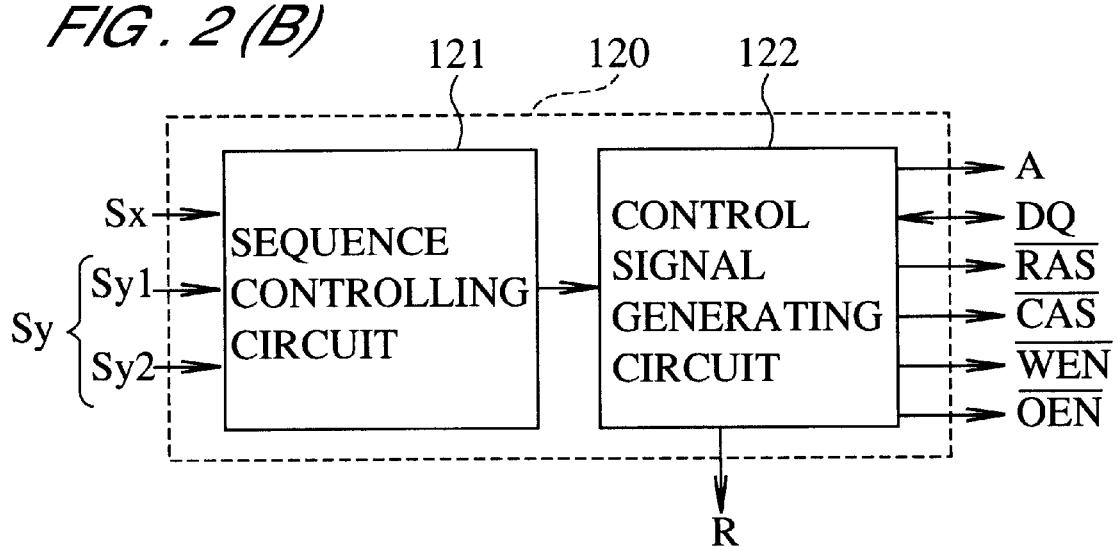

FIG. 2(B) illustrates one example of an internal constitution of the memory controlling circuit 120.

As shown in FIG. 2(B), the memory controlling circuit 120 comprises a sequence controlling circuit 121, and a control signal generating circuit 122.

Controlling circuit 121 is inputted with a processing type signal Sy, determines the type of processing (read/write processing and refresh processing), and executes the sequence control for that process.

Further, the signal generating circuit 122 generates a control signal based on controlling circuit 121 control. As the control signals thereof, signals for controlling a DRAM 200, and a signal for controlling a counter 130 are generated. The signals for controlling DRAM 200 comprise, for example, an address signal A, a data input-output signal DQ, a row address strobe signal /RAS, a column address strobe signal /CAS, a write enable signal /WEN, an output enable signal /OEN, and the like. As a signal for controlling the counter 130, for example, a reset signal R is generated.

In this embodiment, since there are two types of refresh request signals, there are also two types of processing type signals Sy corresponding to refresh processing. That is, type signal Sy corresponding to request signal C1 is (Sy1, Sy2)= (1, 1), and type signal Sy corresponding to request signal C2 is (Sy1, Sy2)=(0, 0). Memory controlling circuit 120 performs the same refresh processing for both type signals Sy.

As the refresh counter 130 in FIG. 1, an up counter or a down counter can be used. This embodiment is explained using as an example a case in which an up counter is used as the refresh counter 130.

Monitoring circuit 140 outputs request signal C1, when the count value of counter 130 is added to a predetermined comparison value X1. Further, monitoring circuit 150 outputs request signal C2, when the count value of counter 130 is added to a predetermined comparison value X2. The value of X1 is set in accordance with the refresh cycle limit required for maintaining the data stored in DRAM 200. The value of X2 should be a smaller value than that of X1, for example, it can be made to equal ½ of X1. For example, if it is assumed that the bit number of counter 130 is n, by constituting monitoring circuit 140 so that it outputs signal C1 when all such n bits are '1', and by constituting monitoring circuit 150 so that it outputs signal C2 when all lower n−1 bits are '1', it is possible to make X2 equal to ½ of X1.

The operation of memory interface circuit 100 is explained below.

When power is supplied to interface circuit 100, the counter 130 begins to count up. Then, when the count value of counter 130 reaches X2, monitoring circuit 150 outputs refresh request signal C2. And when the count value of counter 130 reaches X1, monitoring circuit 140 outputs refresh request signal C1.

As for the memory bus arbitrating circuit 110, when it is inputted with request signals S1–Sn, C1, C2 as described above, it generates signals Sx, Sy in correspondence with the highest priority request signal thereamong. That is, when a plurality of types of request signals are inputted simultaneously to arbitrating circuit 110, the request with the highest priority is executed by memory controlling circuit 120. As mentioned above, of all the request signals, the priority of signal C2 is the lowest, and the priority of signal C1 is the highest. Therefore, when 1 or a plurality of request signals S1–Sn, and signal C2 are inputted simultaneously to arbitrating circuit 110, DRAM 200 is not refreshed. Conversely, when signal C1 is inputted to arbitrating circuit 110, DRAM 200 is refreshed even when other request signals are inputted at the same time.

When memory controlling circuit 120 is inputted with signals Sx, Sy, it controls the operation of DRAM 200 by generating and outputting control signals in accordance with a predetermined sequence. Further, when the process indicated by signals Sx, Sy is refresh, it performs the same refresh processing, whether it is based on signal C1 or whether it is based on signal C2, and once processing is complete, it outputs a reset signal R. The counter 130 resets the count value when signal R is inputted.

In this manner, when the count value of counter 130 reaches X1 in the interface circuit 100 related to this embodiment, because refresh is carried out in a compulsory manner even if there are other processing requests, there is no possibility of DRAM 200 memory data being lost. In contrast thereto, when the count value of counter 130 reaches X2, refresh is performed only when other processing requests are not being carried out. That is, with interface circuit 100, when there are no other processing requests, refresh is performed even if refresh time has not been reached. In accordance therewith, it is possible to reduce the probability of compulsory refresh processing and other processing being requested simultaneously.

Second Embodiment

Figure 3:
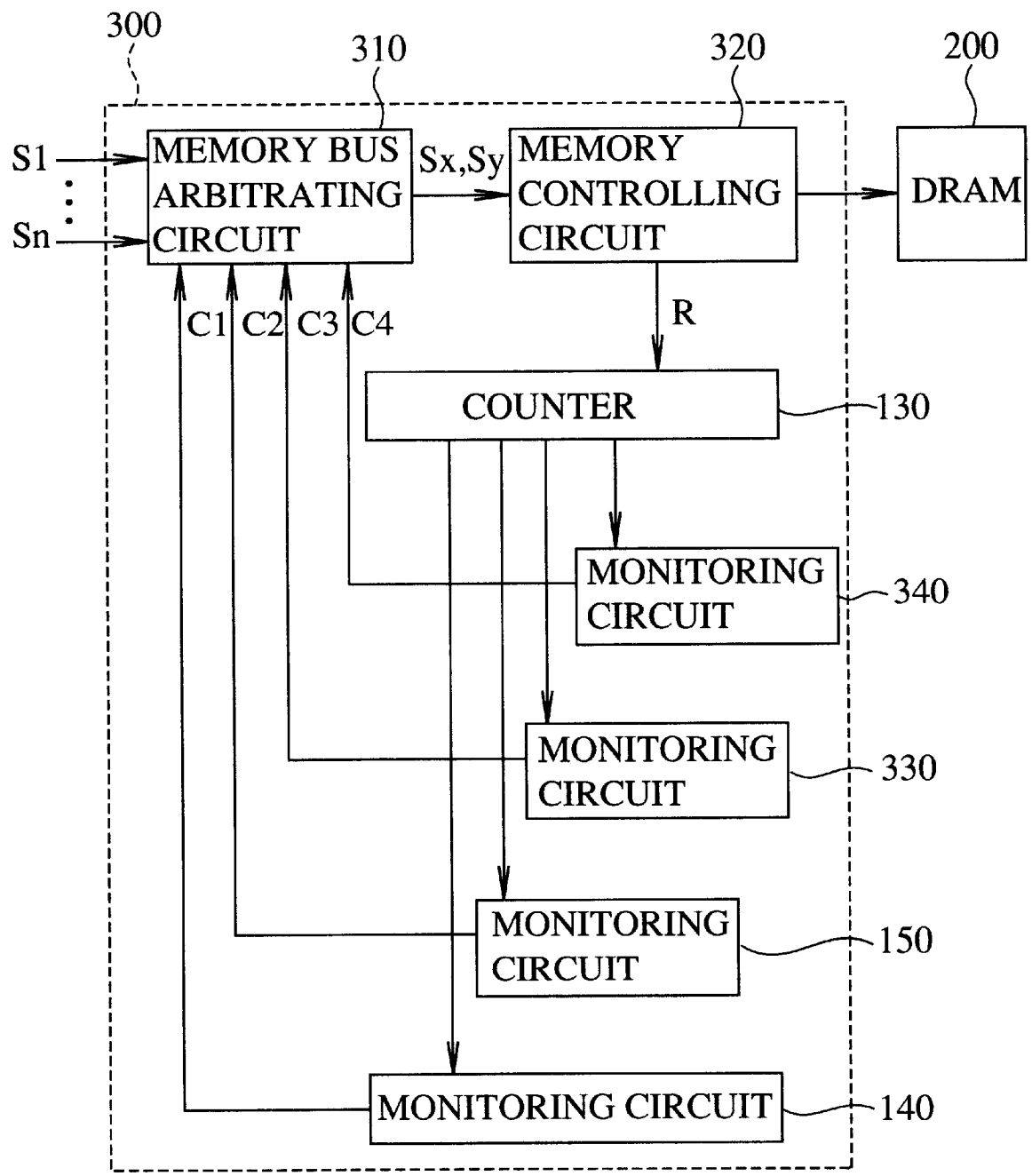
FIG. 3 is a block diagram showing a memory interface circuit related to a second embodiment.

A second embodiment of the present invention is explained using FIG. 3.

In FIG. 3, constituent components having the same reference numerals as in FIG. 1 are of the same constitution, respectively, as those of FIG. 1.

A memory bus arbitrating circuit 310 is inputted with request signals S1–Sn from outside, and is inputted with refresh request signal C1 from monitoring circuit 140, with refresh request signal C2 from monitoring circuit 150, with refresh request signal C3 from monitoring circuit 330, and with refresh request signal C4 from monitoring circuit 340.

When these signals S1–Sn, C1–C4 are inputted, circuit 310 outputs a type signal Sy corresponding to the request signal with the highest priority, together with a bus request signal Sx. For this embodiment, C1 is regarded as the signal with the highest priority, and C4 is regarded as the signal with the lowest priority. The priorities of signals S1–Sn, C2, C3 can be suitably set on the conditions that the priority of C2 be higher than that of C3, and that the priorities of C2 and C3 not be consecutive. For example, in descending order from the highest, the priority is regarded as C1, S1, S2, . . . , Sn–2, C2, Sn–1, C3, Sn, C4. In this embodiment, signals S1–Sn–2, for example, correspond to processing in which the requirement for highspeed execution is high, signal Sn–1 corresponds to processing in which the requirement for highspeed execution is rather low, and signal Sn corresponds to processing in which the requirement for highspeed execution is extremely low.

A memory controlling circuit 320 controls DRAM 200 on the basis of signals Sx, Sy, and executes read/write processing and refresh processing. In this embodiment, since there are four types of refresh request signals, there are also four types of processing type signals Sy corresponding to refresh processing. The memory controlling circuit 320 performs the same refresh processing for all type signals Sy.

Monitoring circuit 330 outputs request signal C3 when the count value of counter 130 is added to a predetermined comparison value X3. And monitoring circuit 340 outputs request signal C4 when the count value of counter 130 is added to a predetermined comparison value X4. The value of X3 should be a smaller value than that of comparison value X2 of monitoring circuit 150, and the value of X4 should be a smaller value than X3. That is, X1–X4 are determined so that refresh request signals C1–C4 are outputted at a faster timing the lower the priority. For example, if it is assumed that the bit number of counter 130 is n, monitoring circuit 140 can be constituted so that it outputs signal C1 when all such n bits are '1', monitoring circuit 150 can be constituted so that it outputs signal C2 when all lower n–1 bits are '1', monitoring circuit 330 can be constituted so that it outputs signal C3 when all lower n–2 bits are '1', and monitoring circuit 340 can be constituted so that it outputs signal C4 when all lower n–3 bits are '1'. In this case, X2 is ½ of X1, X3 is ½ of X2, and X4 is ½ of X3.

The operation of memory interface circuit 300 is explained below.

When power is supplied to interface circuit 300 counter 130 begins to count up. Then, when the count value of counter 130 reaches X4, monitoring circuit 340 outputs refresh request signal C4.

As described above, the priority of signal C4 is the lowest of the request signals. Therefore, when signal C4 alone is inputted to arbitrating circuit 310, controlling circuit 320 executes refresh processing, and when signal C4 is inputted to arbitrating circuit 310 at the same time as another request signal (any of signals S1–Sn), controlling circuit 320 executes the other processing. When refresh processing has been performed, the count value of counter 130 is reset by the controlling circuit 320.

When refresh is not carried out based on signal C4, counter 130 continues to count. Then, when the count value of counter 130 reaches X3, monitoring circuit 330 outputs refresh request signal C3.

The priority of signal C3 is higher than that of request signal Sn, but lower than those of request signals S1–Sn–1. Therefore, even if signal C3 is inputted to arbitrating circuit 310 at the same time as signal Sn, controlling circuit 320 executes refresh processing on a priority basis. Conversely, when signal C3 is inputted to arbitrating circuit 310 at the same time as signals S1–Sn–1, memory controlling circuit 320 does not execute refresh. When refresh processing has been performed, the count value of counter 130 is reset by the controlling circuit 320.

When refresh is not carried out based on signal C3, counter 130 continues to count. Then, when the count value of counter 130 reaches X2, monitoring circuit 150 outputs refresh request signal C2.

The priority of signal C2 is higher than those of request signals Sn, Sn–1, but lower than those of request signals S1–Sn–2. Therefore, even if signal C2 is inputted to arbitrating circuit 310 at the same time as signals Sn, Sn–1, controlling circuit 320 executes refresh processing on a priority basis. Conversely, when signal C2 is inputted to arbitrating circuit 310 at the same time as signals S1–Sn–2, memory controlling circuit 320 does not execute refresh. When refresh processing has been performed, the count value of counter 130 is reset by the controlling circuit 320.

When refresh is not carried out based on signal C2, counter 130 continues to count. Then, when the count value of counter 130 reaches X1, monitoring circuit 140 outputs refresh request signal C1.

The priority of signal C1 is higher than those of request signals S1–Sn. Therefore, when signal C1 is inputted to arbitrating circuit 310, controlling circuit 320 executes refresh processing on a priority basis even if request signals S1–Sn of other processing are inputted simultaneously thereto. Following refresh, the controlling circuit 320 resets the count value of counter 130.

In this manner, when the count value of counter 130 reaches X4 in the interface circuit 300 related to this embodiment, refresh is performed only when other processing requests are not being carried out. Further, when the count value of counter 130 reaches X3, refresh is executed on a priority basis only when processing correspondent to signal Sn, that is, processing for which the requirement for highspeed execution is extremely low, is requested. Furthermore, when the count value of counter 130 reaches X2, refresh is executed on a priority basis only when processing correspondent to signals Sn–1, Sn, that is, processing for which the requirement for highspeed execution is rather low, is requested. In accordance therewith, it is possible to reduce, in accordance with the degree of necessity of highspeed execution requested by other processing, the probability that other processing is not executed for the sake of refresh processing. Contrary thereto, when the counter 130 count value reaches X1, because refresh is performed in a compulsory manner even if there is a request for other processing, there is no possibility that DRAM 200 memory data will be lost.

Third Embodiment

Figure 4:
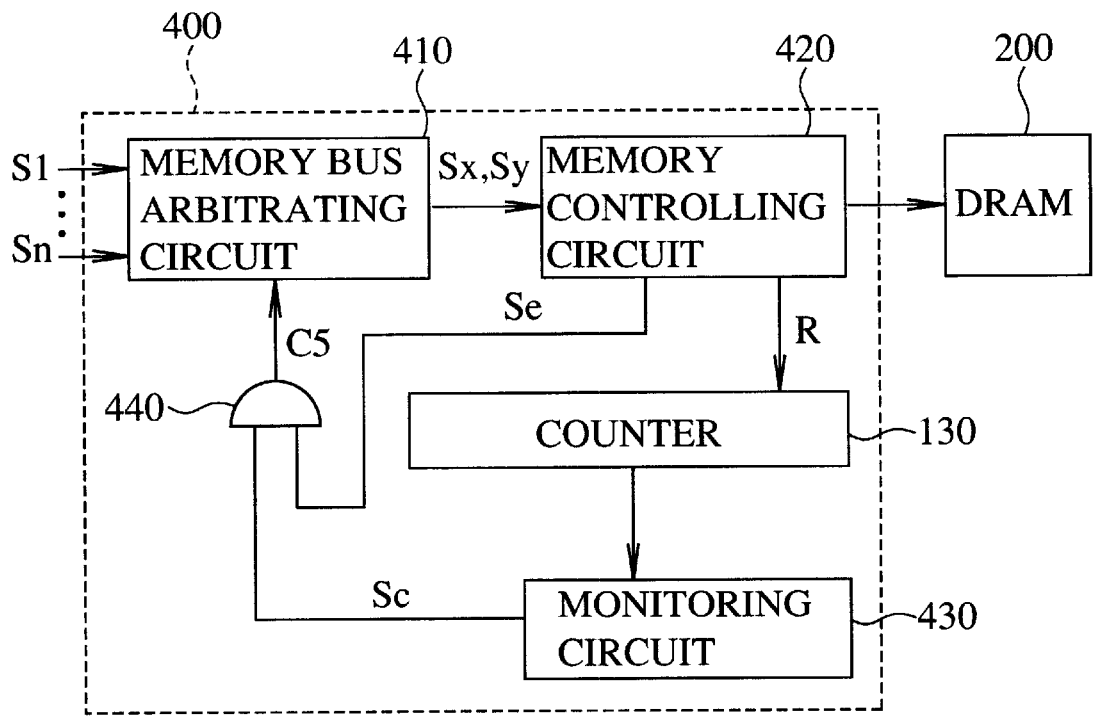
FIG. 4 is a block diagram showing a memory interface circuit related to a third embodiment.

A memory interface circuit related to a third embodiment of the present invention is explained using FIG. 4.

In FIG. 4, constituent components having the same reference numerals as in FIG. 1 are of the same constitution, respectively, as those of FIG. 1.

In interface circuit 400, a memory bus arbitrating circuit 410 is inputted with request signals S1, S2 . . . , Sn from outside, and refresh request signal C5 is inputted from an AND gate 440. Circuit 410 generates and outputs a bus request signal Sx and a processing type signal Sy corresponding to the highest priority request signal of the simultaneously-inputted request signals S1–Sn, C5. For this embodiment, signal C5 is regarded as the request signal with the highest priority. Further, signal S1 is assigned to the process which has the highest priority and highest execution frequency in all process other than refresh. For example, in descending order from the highest, the priority is regarded as C5, S1, S2, . . . , Sn.

A memory controlling circuit 420 control DRAM 200 on the basis of signals Sx, Sy, and executes read/write processing, and refresh processing. Further, controlling circuit 420 outputs a reset signal R when refresh processing based on signal C5 has ended, and outputs a termination signal Se when processing based on signal S1 has ended.

Monitoring circuit 430 outputs signal Sc when the count value of counter 130 reaches a predetermined comparison value X5. The value of X5 is set at a value equivalent to a time shorter than the limit of refresh time required for maintaining data stored in DRAM 200. For example, if it is assumed that the counter 130 bit number is n, by constituting monitoring circuit 140 so that signal Sc is outputted when all n−1 bits are '1', X5 is set to ½ of the limit.

When AND gate 440 is inputted with signal Se and signal Sc, it outputs signal C5.

The operation of memory interface circuit 400 is explained below.

When power is supplied to interface circuit 400, counter 130 begins to count up. Then, when the count value of counter 130 reaches X5, monitoring circuit 430 outputs signal Sc. Signal Sc is maintained by a flip-flop (not shown in the figure) or the like inside monitoring circuit 430.

Conversely, controlling circuit 420 controls DRAM 200 on the basis of signals Sx, Sy. Then, when control of processing is executed on the basis of request signal S1, controlling circuit 420 outputs signal Se after processing ends.

As mentioned above, AND gate 440 outputs signal C5 when signals Se, Sc are both ON. Since signal C5 is the highest priority request signal, when arbitrating circuit 410 is inputted with-signal C5, it causes controlling circuit 420 to refresh DRAM 200. When refresh ends, controlling circuit 420 outputs a reset signal R. The count value of counter 130 is reset by this signal R.

In accordance with the interface circuit 400 related to this embodiment, DRAM 200 refresh is performed immediately after the count value of counter 130 reaches X5, and processing that corresponds to signal S1 ends.

That is, in accordance with this embodiment, processing with the highest priority of processing other than refresh, and for which execution frequency is high, can be executed at high speed, and the execution of refresh can be ensured.

Fourth Embodiment

Figure 5:
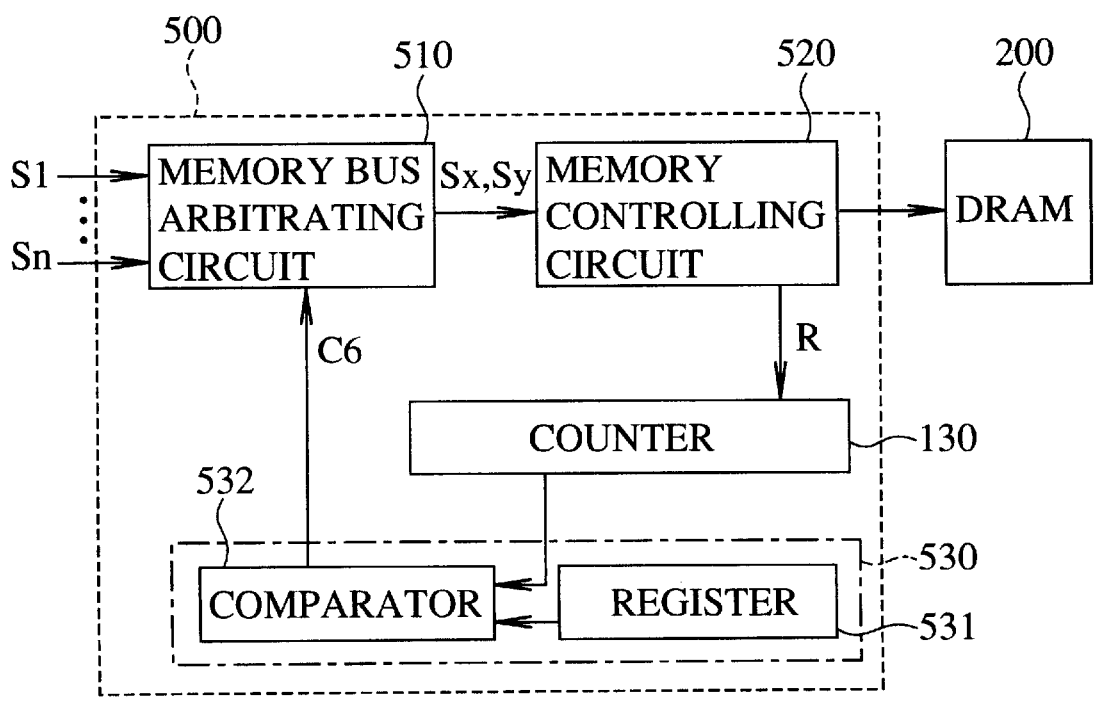
FIG. 5 is a block diagram showing a memory interface circuit related to a fourth embodiment.

A memory interface circuit related to a fourth embodiment of the present invention is explained using FIG. 5.

In FIG. 5, constituent components having the same reference numerals as in FIG. 1 are of the same constitution, respectively, as those of FIG. 1.

In interface circuit 500, a memory bus arbitrating circuit 510 is inputted with request signals S1, S2 . . . , Sn from outside, and refresh request signal C6 is inputted from a monitoring circuit 530. Circuit 510 generates and outputs a bus request signal Sx and a processing type signal Sy corresponding to the highest priority request signal of the simultaneously-inputted request signals S1–Sn, C6. For this embodiment, signal C6 is regarded as the request signal with the highest priority. Further, signal S1 is assigned to the process, which has the highest priority and highest execution frequency in all process other than refresh. For example, in descending order from the highest, the priority is regarded as C6, S1, S2, . . . , Sn.

A memory controlling circuit 520 controls DRAM 200 on the basis of signals Sx, Sy, and executes read/write processing, and refresh processing. Further, controlling circuit 520 outputs a reset signal R when refresh processing has ended.

Monitoring circuit 530 comprises a register 531 as overwrite-capable memory, and a comparator 532. A predetermined comparison value X6 is stored in register 531. This value X6 is inputted from outside the interface circuit 500. It is desirable for the value of X6 to be set so that refresh timing does not overlap with the execution timing of signal S1-based processing. Further, the comparator 532 compares the count value inputted from counter 130 and the memory value inputted from register 531, and when the count value is larger, outputs request signal C6.

The operation of memory interface circuit 500 is explained below.

When power is supplied to interface circuit 500, counter 130 begins to count up, and sequentially outputs count values. Comparator 532, as described above, sequentially compares this count value with a comparison value X6 stored in register 531, and when the count value is larger, outputs request signal C6. Since signal C6 is the highest priority request signal, when signal C6 is inputted, the arbitrating circuit 510 causes the controlling circuit 520 to refresh DRAM 200. When refresh ends, the controlling circuit 520 outputs a reset signal R. The count value of counter 130 is reset by this signal R.

In the interface circuit 500 related to this embodiment, an overwrite-capable memory, that is, register 531 is provided, making it possible for X6 to be changed at will. Therefore, interface circuit 500 facilitates the performing of refresh by selecting a timing when signal S1-based processing is not executed, or a timing when the probability of execution is low.

That is, in accordance with this embodiment, it becomes easy to avoid the simultaneous carrying out of a predetermined processing request and a refresh processing request, and in accordance therewith, highspeed execution of predetermined processing, and the assured execution of refresh are realized.

Fifth Embodiment

Figure 6:
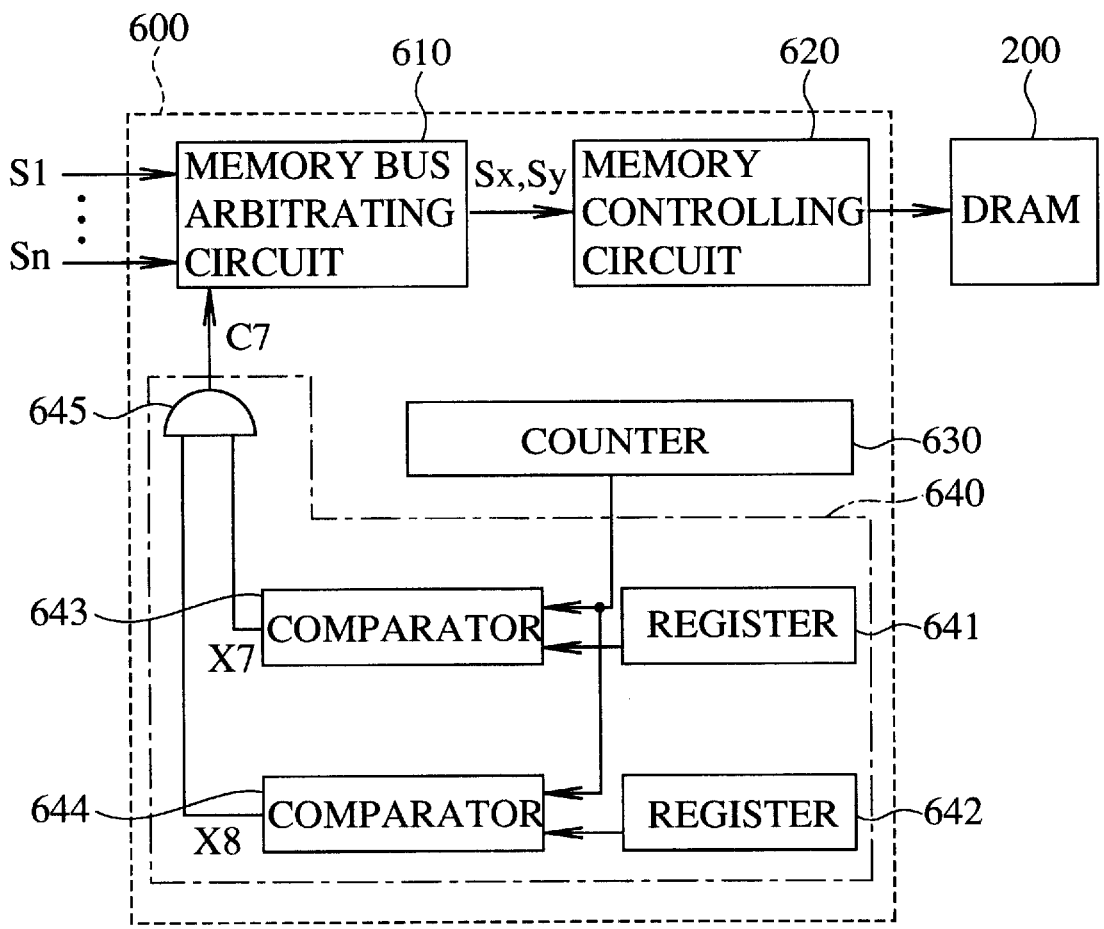
FIG. 6 is a block diagram showing a memory interface circuit related to a fifth embodiment.

A memory interface circuit related to a fifth embodiment is explained using FIG. 6.

As shown in FIG. 6, this memory interface circuit 600 comprises a memory bus arbitrating circuit 610, a memory controlling circuit 620, a counter 630, and a monitoring circuit 640.

The memory bus arbitrating circuit 610 is inputted with request signals S1, S2 . . . , Sn from outside, and refresh request signal C7 is inputted from a monitoring circuit 640. Circuit 610 generates and outputs a bus request signal Sx and a processing type signal Sy corresponding to the highest priority request signal of the simultaneously-inputted request signals S1–Sn, C7. For this embodiment, signal C7 is regarded as the request signal with the highest priority. For example, in descending order from the highest, the priority is regarded as C7, S1, S2, . . . , Sn.

A memory controlling circuit 620 controls DRAM 200 on the basis of signals Sx, Sy, and executes read/write processing, and refresh processing, making it the same as the memory controlling circuits in each of the above-described aspects of the embodiment. However, controlling circuit 620 differs from each of the above-described aspects of the embodiment in that it does not output a reset signal R when refresh processing has ended.

As a counter 630, an ordinary up counter or down counter can be used, and for this embodiment, the explanation makes use of an example in which an up counter is used. The counter 630 operating cycle, that is, the duration from a state in which all bits are '0' until it reaches a state in which all bits are '1,' is set in accordance with the refresh cycle required for maintaining data stored in DRAM 200.

Monitoring circuit 640 comprises registers 641, 642 as overwrite-capable memory, comparators 643, 644, and an AND gate 645. A predetermined comparison value X7 is stored in register 641, and a predetermined comparison value X8 is stored in register 642. These values X7, X8 are inputted to the interface circuit 600 from outside. Comparison values X7, X8 are set so that X7<X8. Further, it is desirable for comparison values X7, X8 to be set so that refresh timing does not overlap with the execution timing of other processing. Comparator 643 compares the count value CNT inputted from counter 630 and the memory value X7 inputted from register 641, and when CNT≦X7, it makes the output signal low level, and when CNT>X7, it makes the output signal high level. Comparator 644 compares the count value CNT inputted from counter 630 and the memory value X8 inputted from register 642, and when CNT≦X8, it makes the output signal high level, and when CNT>X8, it makes the output signal low level. AND gate 645 outputs refresh request signal C7 when comparators 643, 644 are both high level.

The operation of memory interface circuit 600 is explained below.

When power is supplied to interface circuit 600, counter 630 begins to count up, sequentially outputting count values CNT. Comparators 643, 644, as described above, sequentially compare this count value against comparison values X7, X8 stored in registers 641, 642.

Here, when CNT≦X7, because the output of comparator 643 becomes low level, and the output of comparator 644 becomes high level, output C7 of AND gate 645 becomes low level. Therefore, DRAM 200 refresh is not executed.

When X7<CNT≦X8, because the outputs of comparators 643, 644 are both high level, output C7 of AND gate 645 becomes high level. Therefore, DRAM 200 refresh is carried out in the same manner as in each above-described embodiment.

Further, when X8<CNT, because the output of comparator 643 becomes high level, and the output of comparator 644 becomes low level, the output C7 of AND gate 645 becomes low level. Therefore, DRAM 200 refresh is not executed.

Thereafter, when the counter 630 count value returns to '0,' the output of comparator 643 returns to low level, and the output of comparator 644 returns to high level.

By repeating the above operations, DRAM 200 refresh is executed cyclically by interface circuit 600.

As described above, in this embodiment, an overwrite-capable memory, that is, registers 641, 642 are provided, making it possible to change X7, X8 at will. Therefore, interface circuit 600 enables refresh to be performed by selecting a timing when other processing is not executed. When processing other than refresh is cyclically-executed processing, the interface circuit 600 related to this embodiment is especially effective.

As described above, in accordance with this embodiment, it becomes possible to avoid the simultaneous carrying out of a predetermined processing request and a refresh processing request, and in accordance therewith, highspeed execution of predetermined processing, and the assured execution of refresh are realized.

Furthermore, for this embodiment, comparator 643 was constituted so that an output signal is made high level when CNT>X7, and comparator 644 was constituted so that an output signal is made low level when CNT>X8, but comparator 643 can be constituted so that an output signal is made low level when CNT>X7, and comparator 644 can be constituted so that an output signal is made high level when CNT>X8. In this case, an OR gate is utilized in place of the AND gate 645.

Sixth Embodiment

Figure 7:
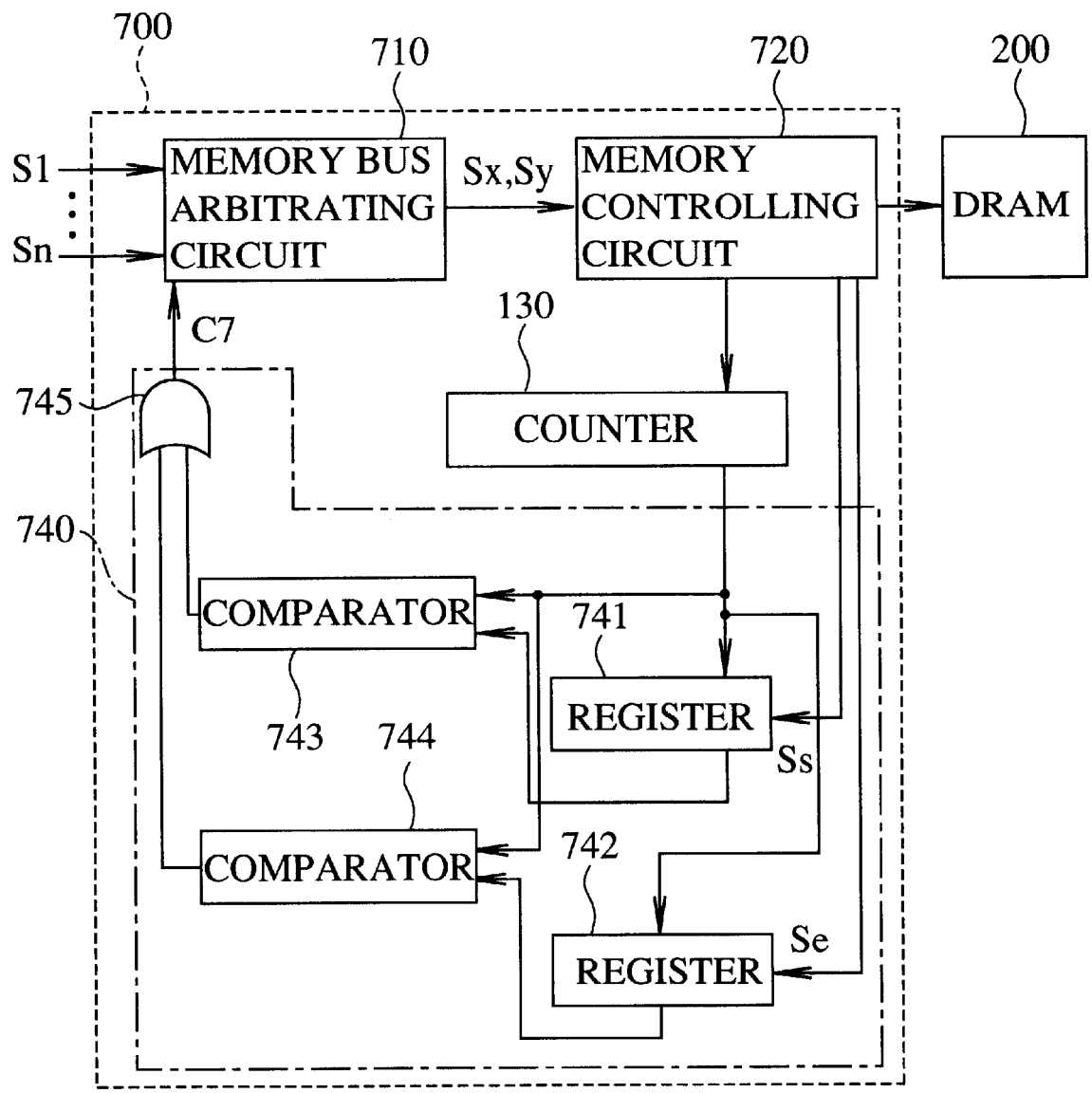
FIG. 7 is a block diagram showing a memory interface circuit related to a sixth embodiment.

A memory interface circuit related to a sixth embodiment is explained using FIG. 7.

In FIG. 7, constituent components having the same reference numerals as in FIG. 1 are of the same constitution, respectively, as those of FIG. 1.

In FIG. 7, a memory bus arbitrating circuit 710 is inputted with request signals S1, S2 . . . , Sn from outside, and refresh request signal C8 is inputted from a monitoring circuit 740. Circuit 710 generates and outputs a bus request signal Sx and a processing type signal Sy corresponding to the highest priority request signal of the simultaneously-inputted request signals S1–Sn, C8. For this embodiment, signal C8 is regarded as the request signal with the highest priority. For example, in descending order from the highest, the priority is regarded as C8, S1, S2, . . . , Sn.

A memory controlling circuit 720 control DRAM 200 on the basis of signals Sx, Sy, and executes read/write processing, and refresh processing. For this embodiment, controlling circuit 720 checks the start timing and end timing of prescribed processing other than refresh, outputs signal Ss at start timing, and outputs signal Se at end timing. Prescribed processing can be 1 type, or a plurality of types. Further, controlling circuit 720 outputs a reset signal R when refresh has ended.

Monitoring circuit 740 comprises registers 741, 742 as overwrite-capable memory, comparators 743, 744, and an OR gate 745. Register 741 stores a count value CNT of counter 130 at signal Se timing. Register 742 stores a count value CNT of counter 130 at signal Se timing. Comparator 743 compares a count value CNT of counter 130 against a stored value X9 of register 741, outputs high level when CNT<X9, and outputs low level when CNT≧X9. Comparator 744 compares a count value CNT of counter 130 against a stored value X10 of register 742, outputs low level when CNT≦X10, and outputs high level when CNT>X10. OR gate 745 outputs refresh request signal C8 when one of comparators 743, 744 is high level.

The operation of memory interface circuit 700 is explained below.

At initialization, registers 741, 742 are each set to a suitable value.

When power is supplied to interface circuit 700, counter 130 begins to count up, sequentially outputting count values CNT.

At this point, a request signal of the above-mentioned 'prescribed processing' is inputted to arbitrating circuit 710, and when this request is transferred to a controlling circuit 720, the controlling circuit 720 commences processing relative to memory 200, outputting signal Ss. When signal Ss is inputted, register 741 stores a count value CNT of the counter 130.

The controlling circuit 720 outputs signal Se when 'prescribed processing' ends. When signal Se is inputted, register 742 stores a count value CNT of the counter 130.

Comparators 743, 744, as described above, sequentially compare this count value CNT against the comparison values X9, X10 stored in registers 741, 742. As mentioned above, comparator 743 outputs low level when CNT≧X9, and comparator 744 outputs low level when CNT≦X10. Therefore, during the timing X9≦CNT≦X10, the OR gate 745 is always low level, and refresh request signal C8 is not outputted. In accordance therewith, memory interface circuit 700 learned the timing when it should not issue a refresh processing request signal. Then, in the next and subsequent cycle operations, the memory interface circuit 700 operates on the basis of this learned information. That is, in the next and subsequent cycle operations, the memory interface circuit 700 does not output refresh request signal C8 during the timing X9≦CNT≦X10.

When a refresh request is issued during the timing CNT<X9, or X10<CNT, the arbitrating circuit 710 causes the controlling circuit 720 to execute DRAM 200 refresh. The controlling circuit 720 outputs reset signal R after refresh ends.

In accordance with this embodiment, a refresh request can be carried out at a timing when there is a high likelihood that the above-mentioned 'prescribed processing' is not being executed. Consequently, DRAM 200 can be refreshed without canceling a 'prescribed processing.' Even when the timing at which a 'prescribed processing' is executed changes for some reason, since the stored contents of registers 741, 742 can be overwritten, the likelihood is small that 'prescribed processing' and refresh will be requested at the same time.

In this manner, in this embodiment, the probability that a predetermined processing request and a refresh processing request will be carried out simultaneously can be reduced, and in accordance therewith, the highspeed execution of a predetermined processing and the assured execution of refresh are realized.

As described above, in accordance with a memory interface circuit related to the present invention, other processing can be executed in memory at high speed, while ensuring the prevention of memory data destruction.

What is claimed is:

1. A memory interface circuit for controlling and refreshing a semiconductor memory device, comprising:
    a memory bus arbitrating circuit which receives a plurality of request signals and which selects a request signal of highest priority among two or more simultaneously received request signals, wherein the plurality of request signals include a first refresh request signal, a second refresh request signal having a priority which is lower than that of the first refresh request signal, and at least one third request signal each having a priority which is lower than that of the first refresh request signal and higher than that of the second refresh request signal;
    a memory controlling circuit which controls the semiconductor memory device in accordance with the request signal of highest priority selected by said memory bus arbitrating circuit;
    a logical counter which generates a count value corresponding to an elapsed time, and which is reset when the semiconductor memory device is refreshed;
    a first monitoring circuit which outputs the first refresh request signal to said memory bus arbitrating circuit when the count value of said logical counter exceeds a first comparison value; and
    a second monitoring circuit which outputs the second refresh request signal to said memory bus arbitrating circuit when the count value of said logical counter exceeds a second comparison value that is smaller than the first comparison value.

2. The memory interface circuit according to claim 1, wherein said logical counter is reset by said memory controlling device.

3. The memory interface circuit according to claim 1, wherein the first refresh request signal has the highest priority among the plurality of request signals.

4. The memory interface circuit according to claim 1, wherein the second refresh request signal has the lowest priority among the plurality of request signals.

5. The memory interface circuit according to claim 1, wherein said logical counter is an up counter.

6. The memory interface circuit according to claim 1, wherein said logical counter is a down counter.

7. The memory interface circuit according to claim 1, wherein said semiconductor memory device is a dynamic random access memory.

8. The memory interface circuit for controlling and refreshing a semiconductor memory device, comprising:
    a memory bus arbitrating circuit which receives a plurality of request signals and which selects a request signal of highest priority among two or more simultaneously received request signals, wherein the plurality of request signals includes first refresh request signals having different priorities from one another and second request signals of a type which is different than the first refresh request signals and having different priorities from one another, and wherein the first refresh request signals do not have immediately successive priorities relative to one another;
    a memory controlling circuit which controls said semiconductor memory device in accordance with the request signal having the highest priority selected by said memory bus arbitrating circuit;
    a logical counter which generates a count value corresponding to an elapsed time, and which is reset when the semiconductor memory device is refreshed; and
    a plurality of monitoring circuits respectively corresponding to the first refresh request signals and respectively associated with a plurality of comparison values, wherein each of said monitoring circuits outputs a corresponding one of the first refresh request signals to said memory bus arbitrating circuit when the count value of said logical counter exceeds an associated comparison value, and wherein a magnitude of the plurality of comparison values is inversely related to the respective priorities of the corresponding first refresh request signals.

9. The memory interface circuit according to claim 8, wherein the logical counter is reset by said memory controlling device.

10. The memory interface circuit according to claim 8, wherein one of the first refresh request signals has the highest priority of the plurality of request signals.

11. The memory interface circuit according to claim 8, wherein one of the first refresh request signals has the lowest priority of the plurality request signals.

12. The memory interface circuit according to claim 8, wherein said logical counter is an up counter.

13. The memory interface circuit according to claim 8, wherein said logical counter is a down counter.

14. The memory interface circuit according to claim 8, wherein said semiconductor memory device is a dynamic random access memory.

* * * * *